(12) United States Patent
Mukohara

(10) Patent No.: US 11,272,647 B2
(45) Date of Patent: Mar. 8, 2022

(54) WORK MACHINE AND MOUNTING METHOD

(71) Applicant: FUJI CORPORATION, Chiryu (JP)

(72) Inventor: Takaji Mukohara, Toyota (JP)

(73) Assignee: FUJI CORPORATION, Chiryu (JP)

( * ) Notice: Subject to any disclaimer, the term of this patent is extended or adjusted under 35 U.S.C. 154(b) by 27 days.

(21) Appl. No.: 16/758,963

(22) PCT Filed: Nov. 14, 2017

(86) PCT No.: PCT/JP2017/040973
§ 371 (c)(1),
(2) Date: Apr. 24, 2020

(87) PCT Pub. No.: WO2019/097585
PCT Pub. Date: May 23, 2019

(65) Prior Publication Data
US 2020/0352066 A1 Nov. 5, 2020

(51) Int. Cl.
*H05K 3/30* (2006.01)
*H05K 13/04* (2006.01)
(Continued)

(52) U.S. Cl.
CPC ..... *H05K 13/0404* (2013.01); *H05K 13/0069* (2013.01); *H05K 13/06* (2013.01); *H05K 13/0812* (2018.08)

(58) Field of Classification Search
CPC .............. H05K 13/04; H05K 13/0404; H05K 13/0406; H05K 13/046
See application file for complete search history.

(56) References Cited

U.S. PATENT DOCUMENTS

| | | | | |
|---|---|---|---|---|
| 5,909,914 A | * | 6/1999 | Imai | ................... H05K 13/0473 29/837 |
| 2002/0046463 A1 | | 4/2002 | Watanabe et al. | |
| 2015/0128411 A1 | * | 5/2015 | Watanabe | .......... H05K 13/0404 29/837 |

FOREIGN PATENT DOCUMENTS

| | | |
|---|---|---|
| JP | 60-249400 A | 12/1985 |
| JP | 61-288500 A | 12/1986 |

(Continued)

OTHER PUBLICATIONS

International Search Report dated Feb. 6, 2018 in PCT/JP2017/040973 filed on Nov. 14, 2017, 2 pages.

*Primary Examiner* — Paul D Kim
(74) *Attorney, Agent, or Firm* — Oblon, McClelland, Maier & Neustadt, L.L.P.

(57) ABSTRACT

A work machine and a mounting method by which end portions of a wire member can be mounted on connecting sections which are arranged variously are provided. A work head includes a first holding section configured to hold a first end portion and a second holding section configured to hold a second end portion. A control device includes a first mounting section configured to mount the first end portion held by the first holding section on a first connecting section, a moving section configured to cause a work head moving device to move the work head in accordance with a position of the second connecting section after having mounted the first end portion on the first connecting section, and a second mounting section configured to mount the second end portion held by the second holding section on a second connecting section.

7 Claims, 17 Drawing Sheets

(51) Int. Cl.
*H05K 13/08* (2006.01)
*H05K 13/00* (2006.01)
*H05K 13/06* (2006.01)

(56) References Cited

FOREIGN PATENT DOCUMENTS

| | | |
|---|---|---|
| JP | 62-119352 U | 7/1987 |
| JP | 2002-124798 A | 4/2002 |
| JP | 2017-10953 A | 1/2017 |
| WO | WO 2014/207802 A1 | 12/2014 |

\* cited by examiner

WORK MACHINE AND MOUNTING METHOD

TECHNICAL FIELD

The disclosure relates to a work machine and a mounting method for mounting a wire member on a connecting section of a circuit substrate.

BACKGROUND ART

Conventionally, there has been a work machine for attaching a wire member to a printed circuit board (for example, Patent Literature 1 and the like). A work machine described in Patent Literature 1 attaches a wire member supplied from a wire member transfer device to a wire member conveyance and insertion device to a printed circuit board. The wire member conveyance and insertion device includes a pair of chucks. The pair of chucks hold corresponding end portions of the wire member and move the wire member in up-down direction while holding the relevant end portions. The pair of chucks insert subsequently the corresponding end portions of the wire member into insertion holes in a printed circuit board from thereabove.

PATENT LITERATURE

Patent Literature 1: JPU62-119352A (Page. 42, FIG. 43(b))

BRIEF SUMMARY

Technical Problem

In the work machine described above, the pair of chucks are individually moved upwards and downwards by rotating a head rotor with the wire member conveyance and insertion device fixed in position. When one of the pair of chucks completes its inserting operation, the other of the pair of chucks is caused to descend to perform its inserting operation. The end portions of the wire member are inserted individually into the two corresponding insertion holes lying adjacent to each other. As a result, with the work machine described above, although the wire member can be inserted into the insertion holes that simply lie adjacent to each other, it has been difficult to perform insertion work of inserting the wire member into insertion holes that are arranged complexly without any difficulty.

The disclosure has been made in view of the problem described above, and an object of the disclosure is to provide a work machine and a mounting method by which end portions of a wire member can be mounted on connecting sections that are arranged variously.

Solutions to Problem

In order to solve the problem described above, according to this patent application, there is provided a work machine including: a substrate holding device configured to hold a circuit substrate including a first connecting section and a second connecting section; a work head configured to hold a wire member including a first end portion and a second end portion so as to mount the wire member on the circuit substrate held by the substrate holding device; a work head moving device configured to move the work head; and a control device, wherein the work head includes: a first holding section configured to hold the first end portion; and a second holding section configured to hold the second end portion, and wherein the control device includes: a first mounting section configured to mount the first end portion, being held by the first holding section, on the first connecting section; a moving section configured to cause the work head moving device to move the work head in accordance with a position of the second connecting section after having mounted the first end portion on the first connecting section; and a second mounting section configured to mount the second end portion, being held by the second holding section, on the second connecting section.

In addition, according to this patent application, there is provided a mounting method for a work machine including a substrate holding device configured to hold a circuit substrate including a first connecting section and a second connecting section, a work head configured to hold a wire member including a first end portion and a second end portion so as to mount the wire member on the circuit substrate held by the substrate holding device, and a work head moving device configured to move the work head, the mounting method being configured to mount the wire member on the circuit substrate, the work head including: a first holding section configured to hold the first end portion; and a second holding section configured to hold the second end portion, the mounting method including: a first mounting step of mounting the first end portion held by the first holding section on the first connecting section; a moving step of causing the work head moving device to move the work head in accordance with a position of the second connecting section after the first end portion has been mounted on the first connecting section; and a second mounting step of mounting the second end portion held by the second holding section on the second connecting section.

Advantageous Effects

According to the solutions described above, the work head is moved after the first end portion has been mounted on the first connecting section. The moving section moves the work head in accordance with the position of the second connecting section, enabling the position of the second holding section and the position of the second connecting section, that is, the position of the second end portion and the position of the second connecting section to be aligned. As a result, even in the case that the first and second connecting sections are arranged complexly, the first and second end portions of the wire member can be mounted on the first and second connecting sections of the circuit substrate.

DESCRIPTION OF EMBODIMENT

Hereinafter, referring to drawings, an embodiment will be described in detail in which a work machine of this patent application is specifically described as a component mounter.

(Configuration of Component Mounter)

Figure 1:
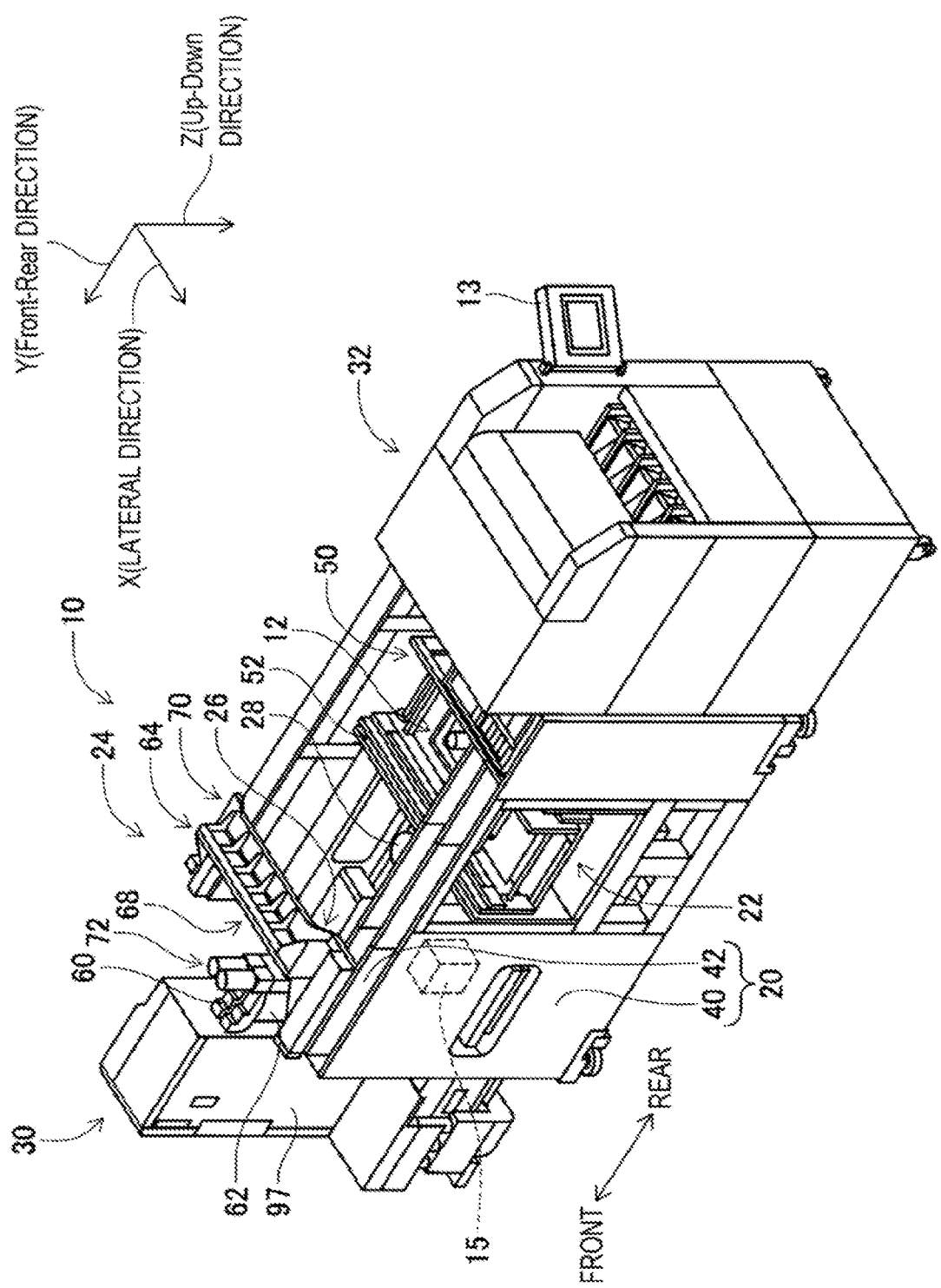
FIG. 1 is a perspective view showing a component mounter of an embodiment.

FIG. 1 shows component mounter 10. Component mounter 10 constitutes a device for mounting a component on circuit substrate 12. Component mounter 10 includes device main body 20, substrate conveyance and holding device 22, component mounting device 24, mark camera 26, part camera 28, component supply device 30, bulk component supply device 32, and cut and clinch device 33 (refer to FIG. 7), and control device (refer to FIG. 9) 34. Incidentally, a circuit board, a three-dimensionally constructed substrate, and the like are raised as circuit substrate 12, and a printed wiring board, a printed circuit board, and the like are raised as the circuit substrate.

Device main body 20 is made up of frame section 40 and beam section 42 provided on frame section 40. Substrate conveyance and holding device 22 is provided at a center of frame section 40 in front-rear direction thereof and includes conveyance device 50 and clamping device 52. Conveyance device 50 constitutes a device configured to convey circuit substrate 12 by rotating a conveyor belt. Clamping device 52 constitutes a device configured to clamp circuit substrate 12 so as to hold it fixedly in a working position. As a result, substrate conveyance and holding device 22 not only conveys circuit substrate 12 but also holds fixedly circuit substrate 12 in a predetermined position. In the following description, a conveyance direction of circuit substrate 12 is referred to as X direction (lateral direction), horizontal direction at right angles to X direction is referred to as Y direction (front-rear direction), and up-down direction is referred to as Z direction. That is, a width direction of component mounter 10 constitutes X direction, and the front-rear direction thereof constitutes the Y direction.

Figure 9:
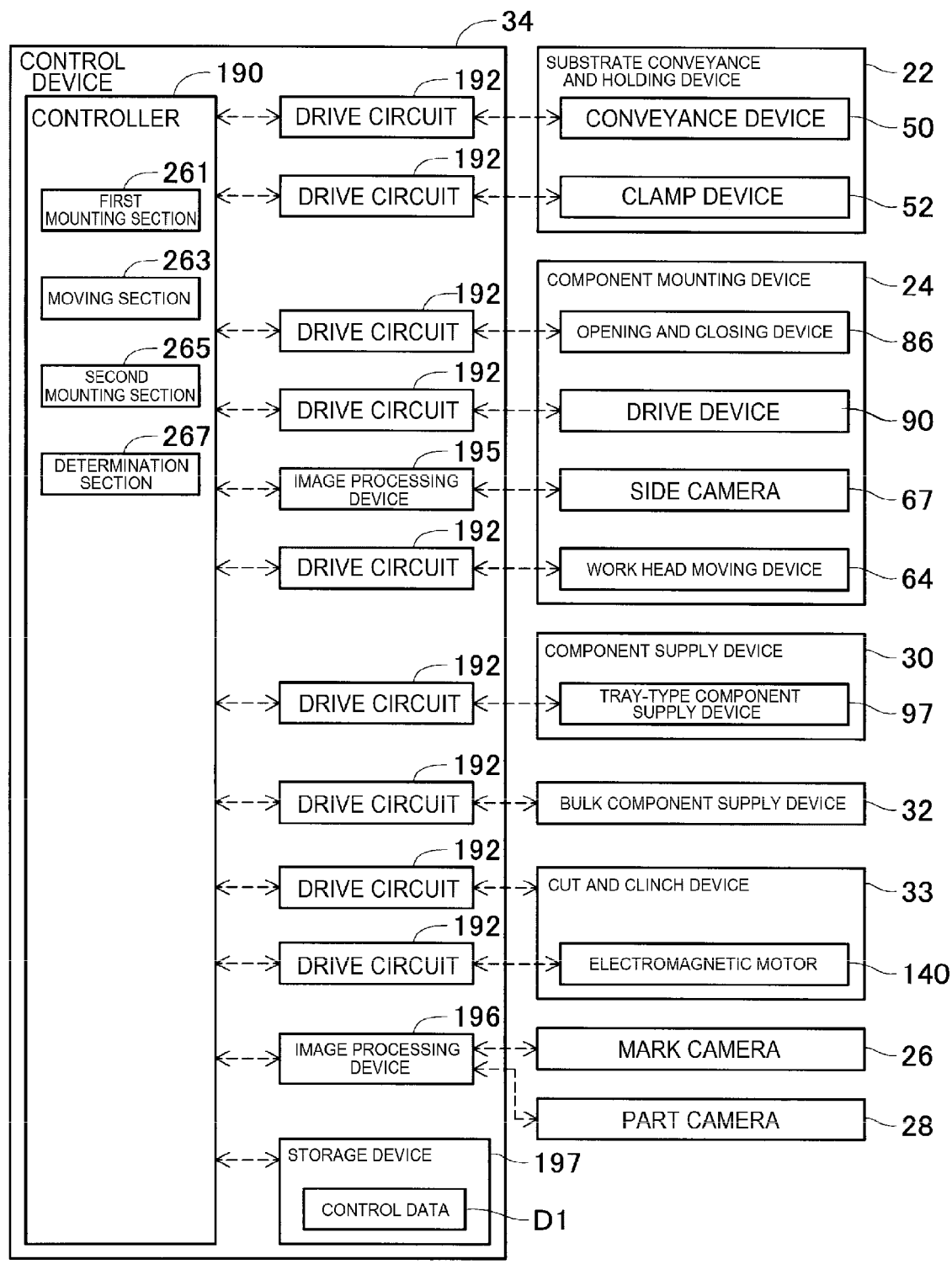
FIG. 9 is a block diagram showing a control device of the component mounter.

Component mounting device 24 is provided at beam section 42 and includes two work heads 60, 62, work head moving device 64, opening and closing device 86 (refer to FIG. 9), and drive device 90 (refer to FIG. 9). Work head 60 includes two chucks 65, 66 (refer to FIGS. 2, 3). Similarly, work head 62 includes two chucks (whose illustration is omitted). Chucks 65, 66 each clamp and hold a component. Two chucks 65 and 66 have the same configuration. Therefore, in the following description, one of the chucks, that is, chuck 65 will mainly be described, and a description of the other chuck, that is, chuck 66 will be omitted as required.

Figure 2:
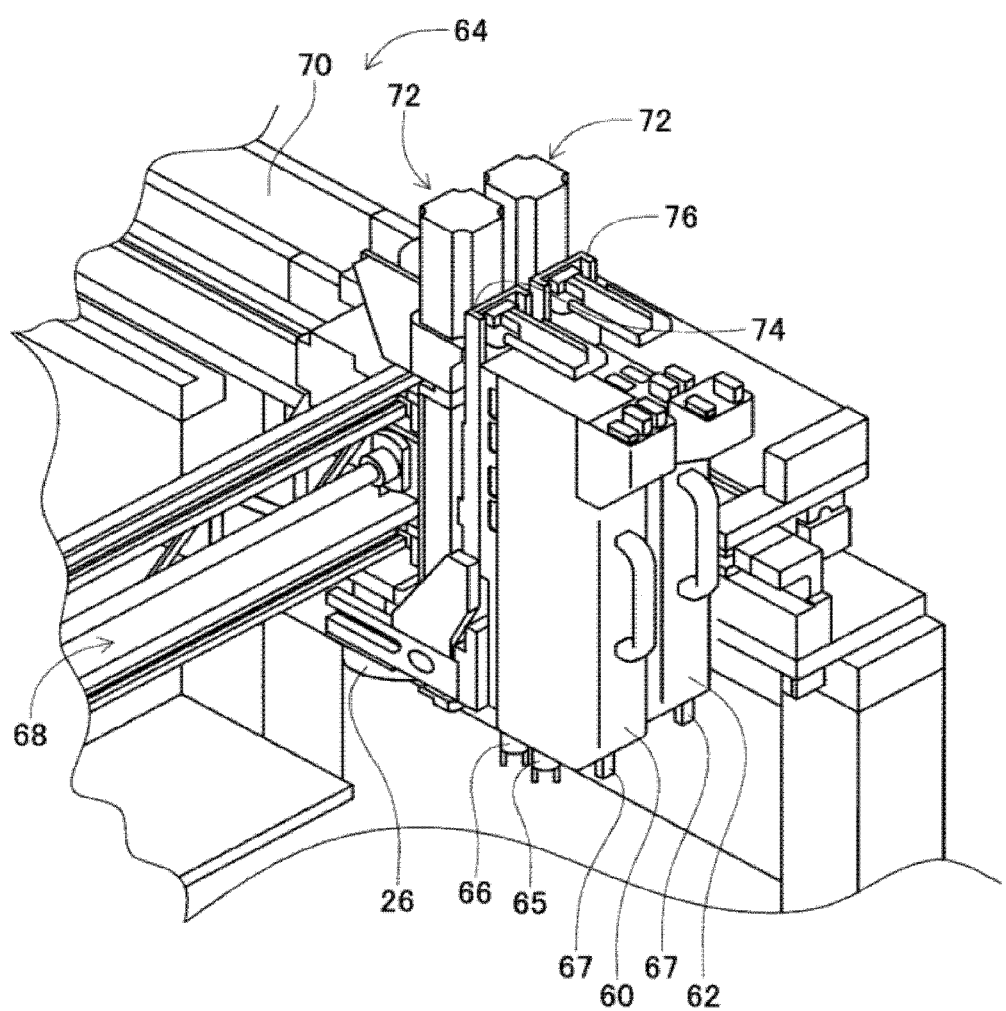
FIG. 2 is a perspective view showing a component mounting device of the component mounter.

Work head moving device 64 includes X-direction moving device 68, Y-direction moving device 70, and Z-direction moving devices 72. Then, two work heads 60, 62 are moved together to an arbitrary position above frame section 40 by X-direction moving device 68 and Y-direction moving device 70. Work heads 60, 62 are detachably attached to sliders 74, 76, respectively, as shown in FIG. 2. Z-direction moving device 72 moves individually sliders 74, 76 in the up-down direction. That is, work heads 60, 62 are individually moved in the up-down direction by Z-direction moving device 72. Work head moving device 64 may be configured so as to move separately two work heads 60, 62 in the X direction and the Y direction.

Figure 3:
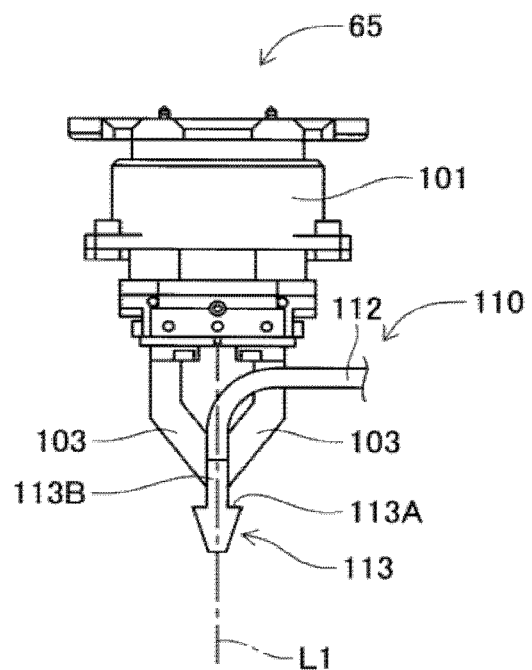
FIG. 3 shows a chuck which is attached to a work head.

Chuck 65 includes main body section 101 and pair of chuck claws 103 as shown in FIG. 3. Pair of chuck claws 103 are provided in such a manner as to extend downwards from a lower surface of main body section 101. Opening and closing device 86 and drive device 90 (refer to FIG. 9) are incorporated, for example, in each of work heads 60, 62. Opening and closing device 86 and drive device 90 include, for example, an electromagnetic motor as a drive source. Pair of chuck claws 103 move to or away from each other as opening and closing device 86 operates accordingly. As a result, chuck 65 causes pair of chuck claws 103 to move to each other to thereby hold a component with pair of chuck claws 103. Chuck 65 clamps or holds, for example, jumper wire 110 shown in FIG. 3 using chuck claws 103. Chuck 65 causes pair of chuck claws 103 to move away from each other so as to enable jumper wire 110 to be released from pair of chuck claws 103. Chuck 65 is detachably attached to a lower end portion of each of work heads 60, 62.

Figure 4:
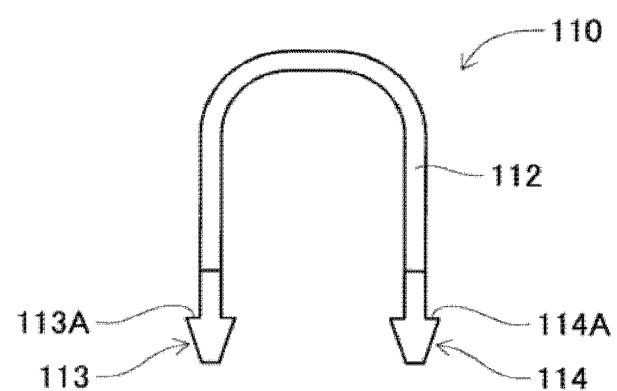
FIG. 4 shows a jumper wire.
Figure 5:
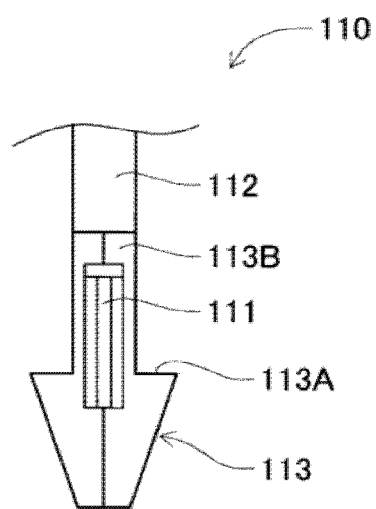
FIG. 5 is an enlarged view showing a first end portion of the jumper wire in an enlarged fashion.

FIG. 4 shows jumper wire 110, which constitutes an example of a wire member of this patent application. FIG. 5 is an enlarged view showing a first end portion 113 of jumper wire 110 in an enlarged fashion, showing a rear view of the first end portion 113 shown in FIG. 4. As shown in FIGS. 4 and 5, jumper wire 110 includes core wire 111 (refer to FIG. 5), cover section 112 covering core wire 111, first end portion 113, and second end portion 114. First end portion 113 is provided at one end portion of jumper wire 110. First end portion 113 is formed by crimping a metallic terminal to a portion of core wire 111 that is exposed by removing cover section 112 at the one end portion. Engagement section 113A is provided at first end portion 113 in such a manner as to be brought into engagement with circuit substrate 12 when first end portion 113 is mounted in circuit substrate 12. Second end portion 114 is provided at the other end portion of jumper wire 110, which is an end portion different from the end portion where first end portion 113 is provided. Similar to first end portion 113, second end portion 114 is formed by crimping a metallic terminal to a portion of core wire 111 that is exposed by removing cover section 112 at the other end portion. Engagement section 114A is provided at second end portion 114 in such a manner as to be brought into engagement with circuit substrate 12 when second end portion 114 is mounted in circuit substrate 12. The wire member of this patent application is not limited to the jumper wire and hence may be a ribbon line or an enameled wire.

Jumper wire 110 is held by work head 60 as a result of, for example, first end portion 113 being held by chuck 65 of work head 60 and second end portion 114 being held by chuck 66 of work head 60. Alternatively, jumper wire 110 is held as a result of, for example, first end portion 113 being held by chuck 65 of work head 60 and second end portion 114 being held by chuck 65 of work head 62. That is, jumper wire 110 may be held by two work heads 60, 62. As shown in FIGS. 3 and 5, pair of chuck claws 103 hold, for example, crimped portion 113b of first end portion 113. This crimped portion 113B is, for example, a portion where the terminal is crimped and clamped to cover section 112 and core wire 111 so as to be tightly fastened thereto. Chuck 65 can convey jumper wire 110 stably as a result of solid crimped portion 113B of jumper wire 110 being held by chuck claws 103. Chuck claws 103 may hold another section of jumper wire 110 such as cover section 112 or the like.

Work heads 60, 62 can each move chucks 65, 66 in the Z-direction (the up-down direction) by driving drive device 90 (refer to FIG. 9). As a result, chuck claws 103 move along the Z-direction in response to the driving of drive device 90. In addition, work heads 60, 62 can each rotate chucks 65, 66 by driving drive device 90. As a result, chuck claws 103 rotate around a rotation axis L1 (refer to FIG. 3) along the Z-direction in response to the driving of drive device 90. Rotation axis L1 around which chucks 65, 66 rotate is not limited to the rotation axis extending along the Z-direction and hence may be a rotation axis extending along a direction that forms a predetermined angle between the Z-direction and itself.

As shown in FIG. 2, side camera 67 configured to image components (jumper wire 110, a lead component, and the like) which are held by chucks 65, 66 is attached to each of work heads 60, 62. Side camera 67 can image, for example, the whole of jumper wire 110 which is held at first end portion 113 by chuck 65 from a side thereof.

Additionally, as shown in FIG. 2, mark camera 26 is attached to slider 74 in such a manner as to be directed downwards and is allowed to move together with work head 60 in the X direction, the Y direction, and the Z direction. As a result, mark camera 26 can image an arbitrary position on frame section 40, whereby mark camera 26 can image a state of a component mounted on circuit substrate 12, a mark provided on a surface of circuit substrate 12, or the like. As shown in FIG. 1, part camera 28 is provided between substrate conveyance and holding device 22 and component supply device 30 on frame section 40 in such a manner as to be directed upwards, that is, in such a manner that an imaging direction thereof is set upwards. As a result, part camera 28 can image components (jumper wire 110 and the like) which are held by chucks 65, 66 of work heads 60, 62.

As shown in FIG. 1, component supply device 30 is provided at a front end of frame section 40 in front-rear direction thereof. Component supply device 30 includes, for example, tray-type component supply device 97 and a feeder-type component supply device (whose illustration is omitted). Tray-type component supply device 97 constitutes a device configured to supply components resting on a tray. The feeder-type component supply device constitutes a device configured to supply components (lead components or the like) using a tape feeder (whose illustration is omitted) or a stick feeder (whose illustration is omitted).

Figure 6:
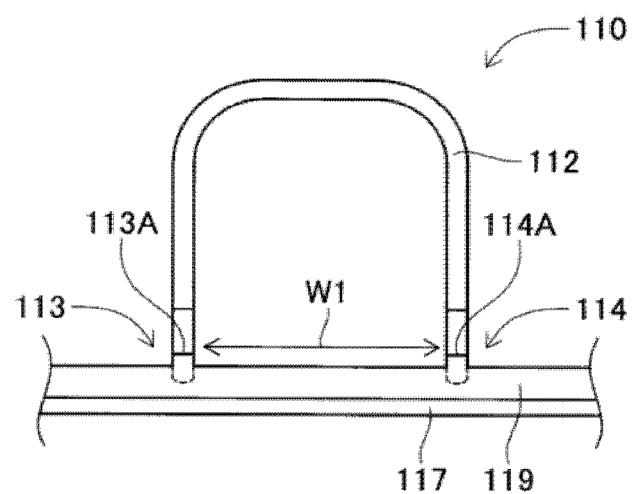
FIG. 6 is a drawing showing a state in which the jumper wire is disposed on a tray of a tray-type component supply device.

FIG. 6 shows a state in which jumper wire 110 is disposed on tray 117 of tray-type component supply device 97. FIG. 6 shows first end portion 113 and second end portion 114 in such a way that first end portion 113 and the like are seen from a side thereof, provided that FIG. 4 shows front views of first end portion 113 and the like in which engagement portion 113A projects sideways in a left-right direction. Jumper wire 110 is disposed, for example, in such a manner that distal end portions of first end portion 113 and second end portion 114 are inserted into holding member 119 disposed on tray 117. Holding member 119 is, for example, a plate of expanded polystyrene. Jumper wire 110 is inserted into holding member 119 with first end portion 113 and second end portion 114 spaced apart by interval W1. In this way, first end portion 113 and second end portion 114 are disposed at interval W1, that is, first end portions 113 and second end portions 114 are disposed at constant intervals W1. As a result, when removing jumper wire 110 from holding member 119, work heads 60, 62 can each move and dispose chucks 65, 66 based on interval W1. Therefore, work heads 60, 62 can remove jumper wire 110 easily. Component mounter 10 may be configured so that jumper wire 110 is imaged by mark cameras 26 on work heads 60, 62 to thereby detect positions of first end portion 113 and second end portion 114 or interval W1 based on image data so imaged. Then, component mounter 10 may automatically dispose chucks 65, 66 based on the positions or the like so detected. In this case, even when multiple jumper wires 110 are disposed at different intervals W1, component mounter 10 can automatically detect interval W1 so as to pick up jumper wire 110 using chucks 65, 66. In other words, jumper wires 110 can easily be disposed on holding member 119.

Additionally, jumper wires 110 may manually be disposed on holding member 119 by an operator, or tray-type component supply device 97 may automatically dispose jumper wires 110 on holding member 119. When jumper wires 110 are disposed automatically, tray-type component supply device 97 may include, for example, a fabrication device configured to fabricate jumper wire 110 by cutting a length of wire member from a long wire material wound around a reel and crimping terminals to both ends of the length of wire member so cut. In addition, tray-type component supply device 97 may include a movable section configured to hold first end portion 113 and second end portion 114 of jumper wire 110 so fabricated so as to inserted them into holding member 119.

As shown in FIG. 1, bulk component supply device 32 is disposed at a rear end portion of frame section 40 in Y direction (front-rear direction) thereof. Bulk component supply device 32 is a device configured to align multiple components (jumper wires 110, lead components, or the like) scattering in bulk so as to be oriented properly for supply and supply them in the aligned state. That is, bulk component supply device 32 is a device configured to align multiple components in arbitrary postures so as to be oriented into a predetermined posture for supply and supply them in the predetermined posture.

Components supplied by component supply device 30 and bulk component supply device 32 include, in addition to jumper wires 110, electronic circuit components, solar cell components, power module components, and the like. Electronic circuit components include a lead component having a lead wire (a radial component, an axial component, or the like) or a component having no lead wire.

Figure 7:
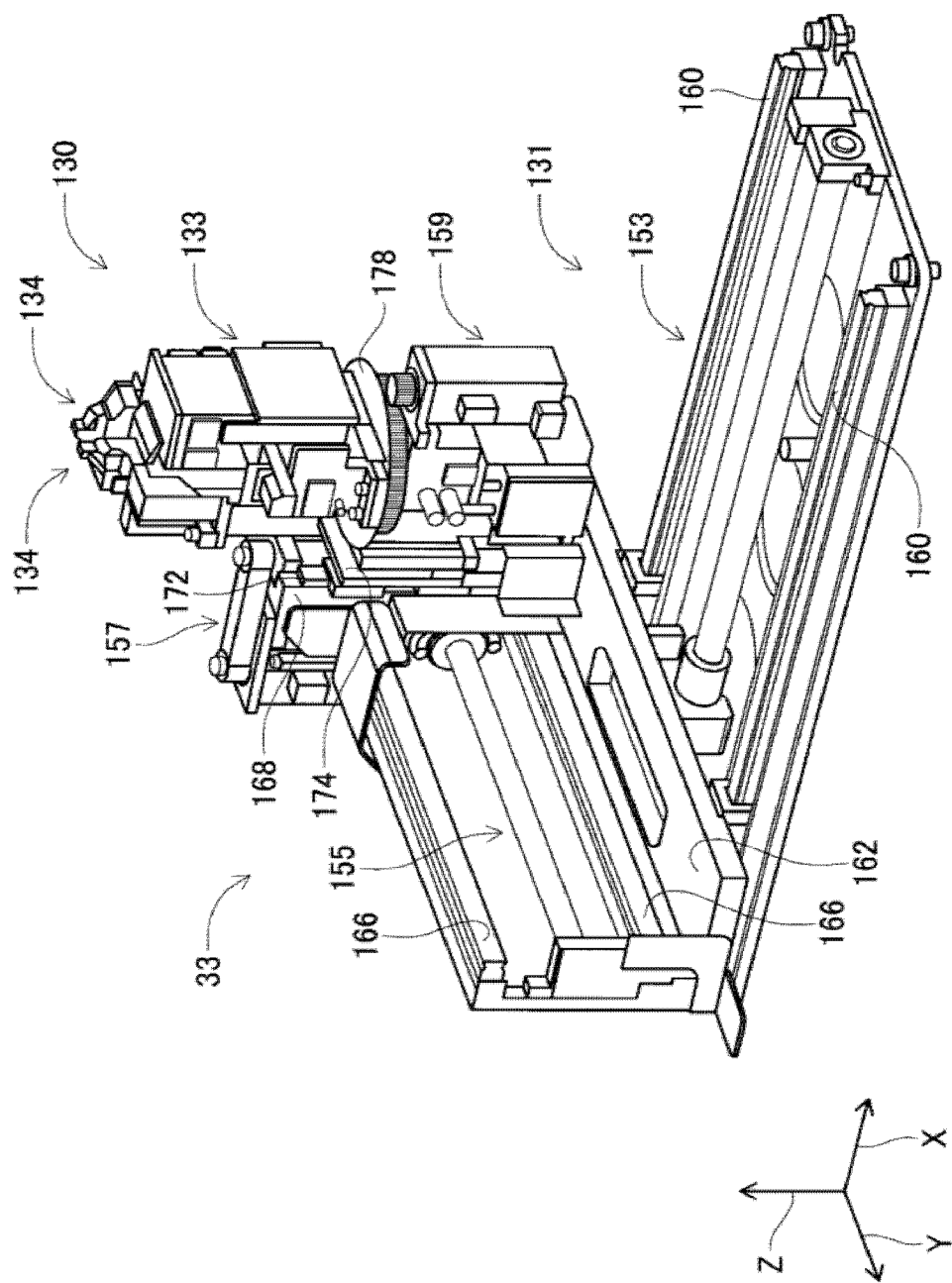
FIG. 7 is a perspective view showing a cut and clinch device.

Cut and clinch device 33 is disposed below conveyance device 50 and includes cut and clinch unit 130 and unit moving device 131 as shown in FIG. 7. Cut and clinch device 33 cuts and bends, for example, a lead wire (a lead wire of a lead component or the like) that is inserted into a through hole formed in circuit substrate 12. As shown in FIG. 7, cut and clinch device 130 includes unit main body 133, pair of slide bodies 134, and the like. In a state shown in FIG. 7, pair of slide bodies 134 can move towards or away from each other in the X direction. Cut and clinch device 33 include multiple electromagnetic motors 140 (refer to FIG. 9) for related devices and mechanisms. Cut and clinch device 33 changes a distance between pair of slide bodies 134 by operating electromagnetic motor 140.

Figure 8:
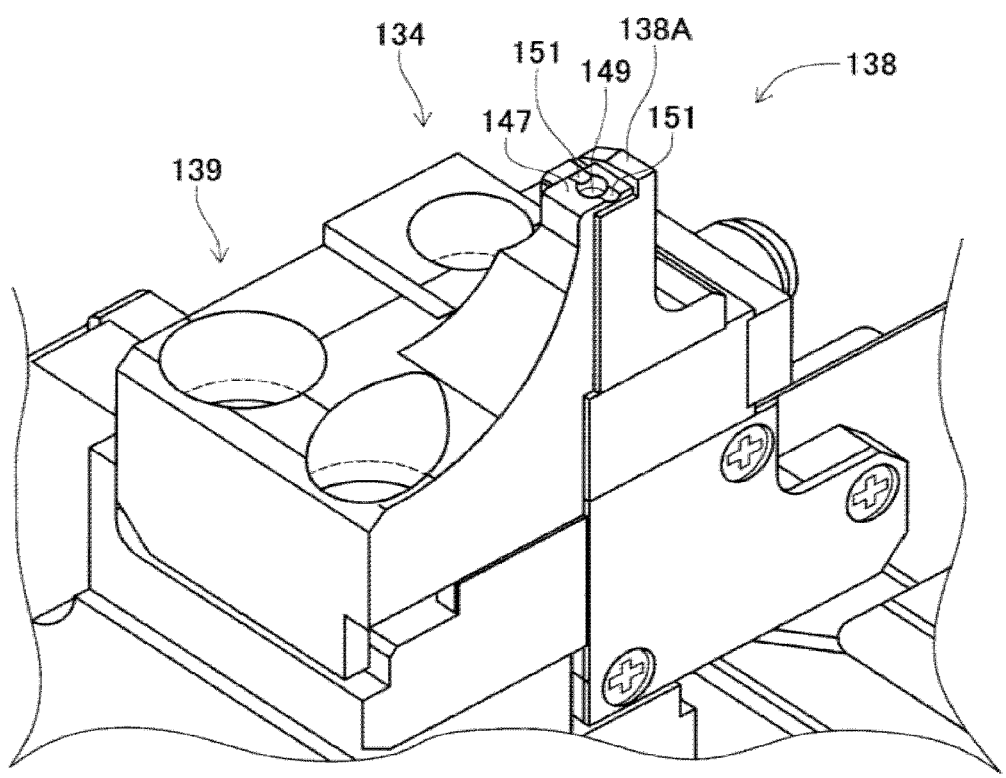
FIG. 8 is an enlarged view showing an upper end portion of a slide body.

FIG. 8 shows an enlarged view of a distal end portion of slide body 134 of pair of slide bodies 134. As shown in FIG.

8, each of pair of slide bodies 134 includes fixed section 138 and movable section 139. Cut and clinch device 33 moves slidably movable section 139 towards fixed section 138 by operating electromagnetic motor 140. An upper end portion of fixed section 138 is tapered. An upper end portion of movable section 139 is also tapered. Bend portion 147 bent into an L-shape is formed at the upper end portion of movable section 139. Bent portion 147 extends upwards above an upper end face of fixed section 138, and bent portion 147 and the upper end face of fixed section 138 face each other via a slight clearance disposed therebetween in the Z direction.

Through hole 149 is formed in bent portion 147 in such a manner as to penetrate it in the Z-direction. This through hole 149 communicates with an insertion hole (whose illustration is omitted) penetrating fixed section 138 in the Z-direction. In component mounting work, a lead wire of a lead component is inserted into insertion hole 149 in movable section 139 and the insertion hole in fixed section 138 from above. A movable blade is provided in insertion hole 149 in movable section 139. Additionally, a fixed blade is provided in the insertion hole of fixed portion 138 in such a manner as to face the movable blade. Cut and clinch device 33 moves slidably movable section 139 towards fixed section 138 to thereby cut the lead wire inserted into insertion hole 149.

Guide groove 151 is formed on an upper end face of bent portion 147 in such a manner as to extend in a sliding direction of movable section 139. Guide groove 151 is formed in such a manner as to straddle an opening of insertion hole 149 in the X direction. Guide groove 151 links with insertion hole 149. Guide groove 151 opens to both side surfaces of bent portion 147. Cut and clinch device 33 continues to move slidably movable section 139 towards fixed section 138 even after the lead wire has been cut to thereby bend the lead wire so cut while inserting the relevant lead wire in guide groove 151.

Additionally, as shown in FIG. 7, unit moving device 131 includes X-direction moving device 153, Y-direction moving device 155, Z-direction moving device 157, and rotation device 159. X-direction moving device 153 includes slide rails 160 and X slider 162. Slide rails 160 are provided in such a manner as to extend in the X direction. X slider 162 is slidably held on slide rails 160. X slider 162 moves in the X direction when driven accordingly by electromagnetic motor 140 (refer to FIG. 9). Y-direction moving device 155 includes slide rails 166 and Y slider 168. Slide rails 166 are provided on X slider 162 in such a manner as to extend in the Y direction. Y slider 168 is slidably held by on slide rails 166. Y slider 168 moves in the Y direction when driven accordingly by electromagnetic motor 140 (refer to FIG. 9). Z-direction moving device 157 includes slide rails 172 and Z slider 174. Slide rails 172 are provided on Y slider 168 in such a manner as to extend in the Z direction. Z slider 174 is slidably held on slide rails 172. Z slider 174 moves in the Z direction when driven accordingly by electromagnetic motor 140 (refer to FIG. 9).

Rotation device 159 includes rotary table 178 of a generally circular disk-like shape. Rotary table 178 is supported on Z slider 174 in such a manner as to rotate around its own axis and rotates when driven accordingly by electromagnetic motor 140 (refer to FIG. 9). Then, cut and clinch unit 130 described above is provided on rotary table 178. According to the structure described above, cut and clinch unit 130 not only moves to an arbitrary position using X-direction moving device 153, Y-direction moving device 155, and Z-direction moving device 157 but also rotates on its own axis to an arbitrary angle using rotation device 159. As a result, cut and clinch unit 130 can be located in an arbitrary position below circuit substrate 12 held by clamping device 52 (refer to FIG. 1).

As shown in FIG. 9, control device 34 includes controller 190, multiple drive circuits 192, image processing devices 195, 196, and storage device 197. Multiple drive circuits 192 are connected to conveyance device 50, clamping device 52, work head moving device 64, opening and closing device 86, drive device 90, tray-type component supply device 97, bulk component supply device 32, electromagnetic motors 140, and the like which are described above.

Controller 190 includes CPU, ROM, RAM, and the like, is made up mainly of a computer, and is connected to multiple drive circuits 192. Controller 190 controls substrate conveyance and holding device 22, component mounting device 24, and the like so as to control the operation of component mounter 10 in a supervisory fashion. In this embodiment, controller 190 reads in control data D1 preserved in storage device 197 and executes mounting work of mounting jumperwire 110 or the like on circuit substrate 12. Storage device 197 includes, for example, a hard disk, a memory, and the like. Data on, for example, a control program for controlling the operation of mounter 10, types of circuit substrates 12 to be produced, types of components to be mounted, mounting positions of components, and the like are set in control data D1. In this embodiment, interval W1 of jumper wires 110 shown in FIG. 6 and set values for mounting jumper wires 110 are preserved in control data D1. When referred to herein, set values are values indicating, for example, positions where chucks 65, 66 which hold jumper wire 110 are disposed on circuit substrate 12, speeds at which chucks 65, 66 are moved, angles through which chucks 65, 66 are rotated, distances over which chucks 65, 66 move, and the like. In addition, set values are values indicating, for example, a target load, an upper limit load, a lower limit load, and the like for pushing first end portion 113 and second end portion 114 into through holes in circuit substrate 12 using chucks 65, 66.

Controller 190 is also connected to image processing device 195. Image processing device 195 processes image data imaged by side camera 67 of component mounting device 24. Controller 190 detects, for example, a position of first end portion 113 of jumper wire 110 held by chuck 65 or the like from the results of the processing by image processing device 195.

Additionally, controller 190 is also connected to image processing device 196. Image processing device 196 process image data imaged by mark camera 26 and part camera 28. Controller 190 acquires various types of information detected from the results of the processing by image processing device 196. Controller 190 detects, for example, a state of jumper wire 110 mounted on circuit substrate 12 or identification information provided for circuit substrate 12 by processing image data imaged by mark camera 26 using image processing device 196. Controller 190 detects, for example, a position of jumper wire 110 held by chucks 65, 66 or the like by processing image data imaged by part camera 28 using image processing device 196. For this reason, controller 190 may detect a held state of jumper wire 110 or the like based on image data imaged by part camera 28. Controller 190 may detect a held state of jumper wire 110 or the like using both image data imaged by side camera 67 and part camera 28.

(Mounting Operation of Jumper Wire 110)

Figure 10:
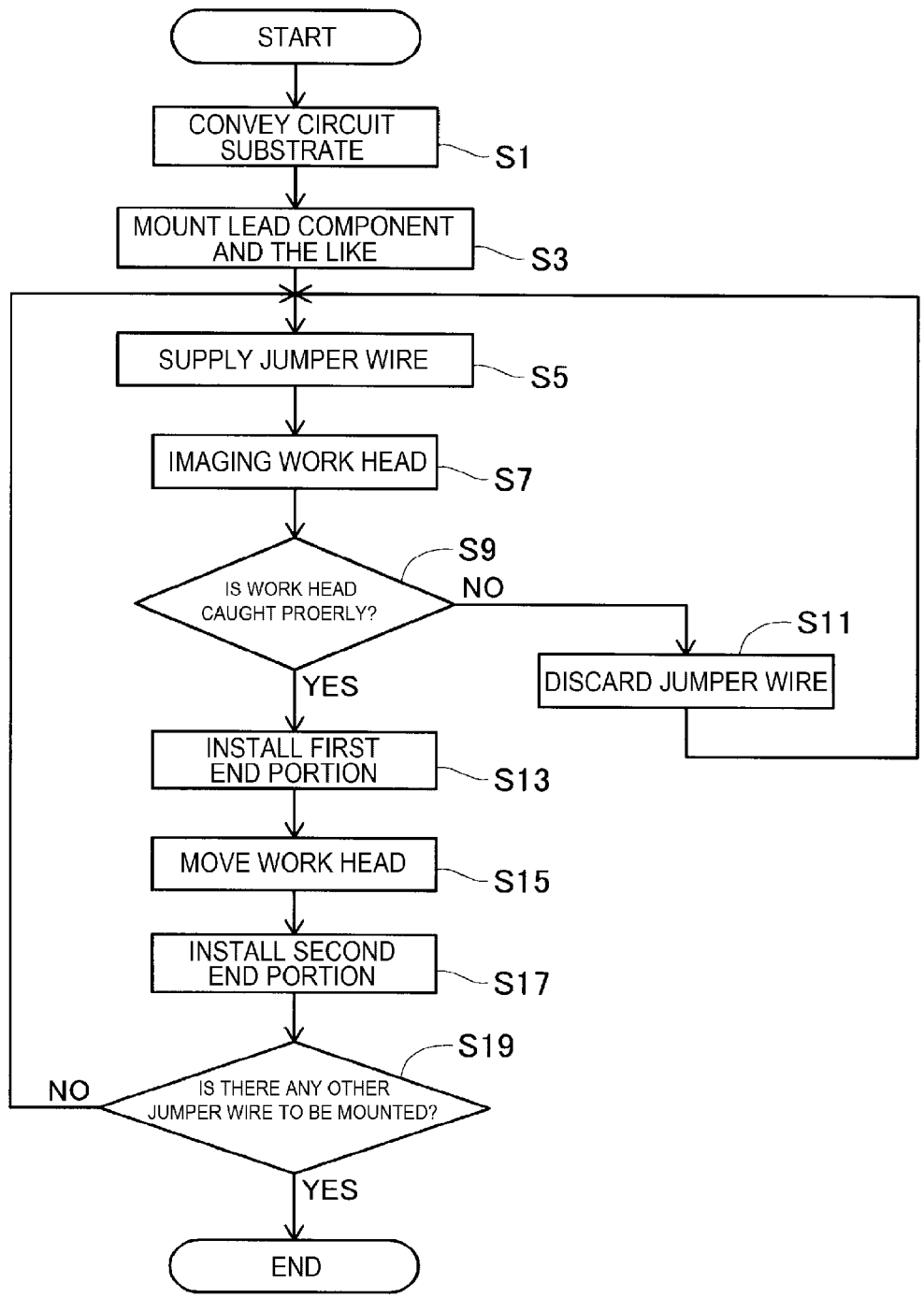
FIG. 10 is a flow chart showing a flow of component mounting operations performed by the component mounter.

With configuration described above, component mounter 10 mounts a component such as jumper wire 110 on circuit substrate 12 held by substrate conveyance and holding device 22. FIG. 10 is a flow chart showing a flow of component mounting operations performed by component mounter 10. FIG. 10 shows an example of a processing procedure, and a processing order or the like can be changed. In the flow chart shown in FIG. 10, operations associated with mounting work of jumper wire 110 are shown in detail, while other operations are shown briefly.

Controller 190 of control device 34 executes processing operations shown in FIG. 10 by executing the control program installed in control data D1. The control program is generated by a user in a management computer (whose illustration is omitted) configured to manage a production line of component mounter 10. The control program is transmitted from the management computer to component mounter 10 and is then stored in storage device 197 of controller 190. Controller 190 executes mounting work based on the control program stored in storage device 197. In the following description, a control executed by controller 190 may be described simply by a device name from time to time. For example, a description reading "substrate conveyance and holding device 22 conveys circuit substrate 12" may mean that "controller 190 executes the control program to cause substrate conveyance and holding device 22 to convey circuit substrate 12".

Firstly, in step (hereinafter, referred to simply as "S") 1 in FIG. 10, substrate conveyance and holding device 22 conveys circuit substrate 12 from, for example, an upstream device along the production line into component mounter 10 and conveys it further to a working position. Clamping device 52 holds fixedly circuit substrate 12 in the working position. Controller 190 drives work head moving device 64 so as to move work heads 60, 62. Mark camera 26 moves to a position above circuit substrate 12 and images circuit substrate 12. Controller 190 detects the identification information provided for circuit substrate 12 based on the image data imaged by mark camera 26. Controller 190 calculates information on the holding position of circuit substrate 12 or the like based on the image data imaged by mark camera 26.

Next, in S3, controller 190 executes mounting work of mounting various components (component 210 and the like in FIG. 16) such as a lead component and the like. Component supply device 30 or bulk component supply device 32 supplies various types of components in a predetermined supply position. Work heads 60, 62 move to a position above the supply position where components are supplied to catch and hold components using pairs of chuck claws 103 (refer to FIG. 3). Additionally, work heads 60, 62 image the components held by chucks 65, 66 using corresponding side cameras 67. Controller 190 detects holding positions of the components or the like based on image data imaged by side cameras 67. Controller 190 may detect holding positions of the components using image data imaged by part cameras 28. Controller 190 moves work heads 60, 62 to a position above circuit substrate 12 so as to mount the components on circuit substrate 12. For example, in moving work heads 60, 62, controller 190 corrects an error in the holding positions of the components. When work heads 60, 62 move to the position above circuit substrate 12, drive devices 90 are driven to cause chucks 65, 66 to descend. For example, chuck 65 inserts the lead wire of the lead component that chuck 65 holds into the through hole in circuit substrate 12. Cut and clinch device 33 cuts and bends the lead wire inserted into the through hole in circuit substrate 12. Controller 190 repeats a series of operations like those described above so as to mount multiple components on circuit substrate 12.

Next, after having mounted various types of components on circuit substrate 12, controller 190 starts mounting work for jumper wire 110. For example, controller 190 connects a power supply circuit of circuit substrate 12 with other components or wiring patterns using jumper wires 110. In the following description, a case will be described in which jumper wire 110 is mounted on circuit substrate 12 using chucks 65, 66 of work head 60 of two work heads 60, 62.

Firstly, in S5, jumper wire 110 is supplied. Tray-type component supply device 97 of component supply device 30 moves jumper wire 110 resting on tray 117 (refer to FIG. 6) to the supply position (S5). Work head 60 moves to a position above the supply position where jumper wire 110 is supplied and catches and holds jumper wire 110 so supplied using chuck claws 103 of chucks 65, 66.

Figure 11:
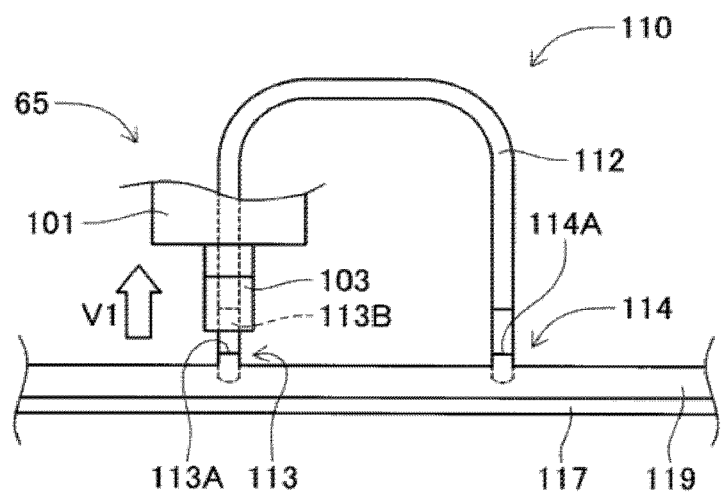
FIG. 11 is a schematic drawing showing a state in which the jumper wire is being removed by a chuck.
Figure 12:
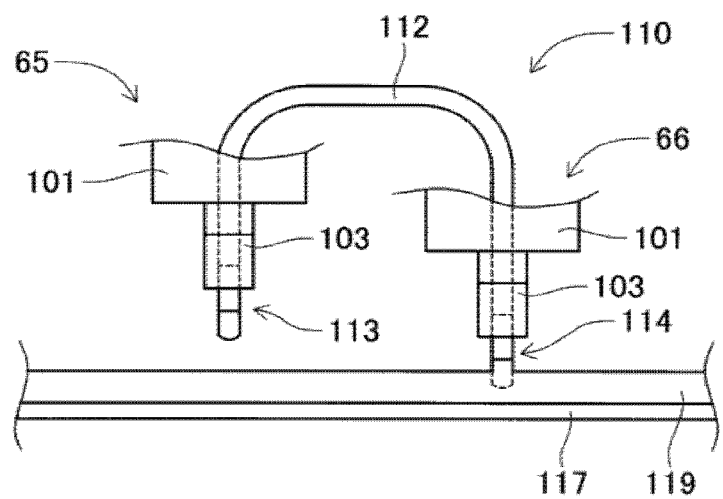
FIG. 12 is a schematic drawing showing a state in which the jumper wire is being removed by the chuck.
Figure 13:
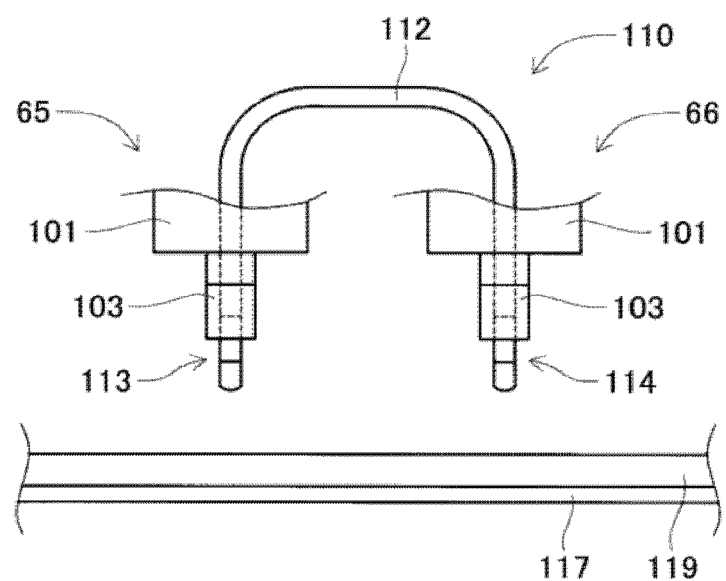
FIG. 13 is a schematic drawing showing a state in which the jumper wire has been removed by the chuck.

FIGS. 11 to 13 schematically show states in which jumper wire 110 is picked up to be removed using chucks 65, 66. When work head 60 moves to the position above the supply position of tray-type component supply device 97, mark camera 26 images jumper wire 110. Controller 190 detects a position or the like of jumper wire 110 to be picked up based on image data imaged by mark camera 26. Controller 190 controls work head moving device 64 based on the detected position or the like and corrects the position of chuck 65 of work head 60. In addition, controller 190 drives drive device 90 (refer to FIG. 9) so as to rotate chuck 65 and corrects a rotational position of chuck claws 103. Controller 190 drives drive device 90 so as to cause chuck 65 to descend. Work head 60 drives opening and closing device 86 (refer to FIG. 9) so as to open pair of chuck claws 103 of chuck 65.

As shown in FIG. 11, when chuck 65 descends as down as a predetermined position, work head 60 drives opening and closing device 86 so as to close chuck claws 103. Pair of chuck claws 103 catches first end portion 113, for example, crimped portion 113B (refer to FIGS. 3, 5) of jumper wire 110. After first end portion 113 is caught by chuck claws 103, work head 60 drives drive device 90 so as to cause chuck 65 to ascend. First end portion 113 is removed from holding member 119 as chuck 65 ascends. As shown in FIG. 12, first end portion 113 is removed from holding member 119 and is kept held by chuck 65. In the description made above, while the position of chuck 65 in the up-down direction is adjusted by driving drive device 90, the disclosure is not limited to this configuration. For example, Z-direction moving device 72 of work head moving device 64 may be driven so as to adjust the position of chuck 65 in the up-down direction. In addition, the position of chuck 65 may be adjusted in the up-down direction using both drive device 90 and Z-direction moving device 72.

Similarly, work head 60 causes chuck 66 to catch second end portion 114 and removes second end portion 114 from holding member 119. In the following description, the same operations as those performed by chuck 65 will be omitted as required. As shown in FIG. 12, work head 60 drives drive device 90 so as to cause chuck 66 to ascend. Controller 190 causes work head moving device 64 to move work head 60 based on the image data imaged by mark camera 26 and interval W1 (refer to FIG. 6) of jumper wire 110 so as to correct the position of chuck 66. Controller 190 acquires, for example, interval W1 from control data D1. Chuck 66 is disposed in a position corresponding to interval W1, that is, a position corresponding to second end portion 114. In addition, controller 190 drives drive device 90 so as to rotate chuck 66 and corrects a rotational position of chuck claws 103. Work head 60 drives drive device 90 so as to cause chuck 66 to descend. Work head 60 drives opening and closing device 86 so as to catch second end portion 114 using chuck claws 103 of chuck 66. Work head 60 causes chuck 66 to ascend so as to remove second end portion 114 from holding member 119. As shown in FIG. 13, first end portion 113 and second end portion 114 of jumper wire 110 are both removed from holding member 119, and jumper wire 110 is kept held by chucks 65, 66, that is, kept held by work head 60 (S5). In the example described above, while work head 60 moves sequentially chucks 65, 66 so as to remove sequentially first end portion 113 and second end portion 114 from holding member 119, the disclosure is not limited to this configuration. Work head 60 may move chucks 65, 66 simultaneously so as to remove first end portion 113 and second end portion 114 from holding member 119 simultaneously. As a result, jumper wire 110 can be removed more quickly from holding member 119.

Next, controller 190 drives work head moving device 64 and moves work head 60 to a position lying above circuit substrate 12. Controller 190 causes part camera 28 to image work head 60 from below while moving work head 60 (S7).

Next, controller 190 determines on a state in which jumper wire 110 is caught based on image data imaged by part camera 28 (S9). Controller 190 determines whether jumper wire 110 is caught properly by chucks 65, 66 based on the image data imaged by part camera 28 (S9). If controller 190 determines that jumper wire 110 is not caught properly (S9: NO), controller 190 executes a processing of discarding jumper wire 110. When referred to herein, the case in which jumper wire 110 is not caught properly means a case in which the position where first end portion 113 is caught by chuck claws 103 deviates from a desired position (crimped portion 113B or the like). Alternatively, the case in which jumper wire 110 is not caught properly means a case in which chuck 65 fails to catch first end portion 113 properly. Further, the case in which jumper wire 110 is not caught properly means a case in which jumper wire 110 held by work head 60 partially fails.

As shown in FIG. 1, in this embodiment, component mounter 10 includes discard box 15 which is provided between conveyance device 50 and component supply device 30 in the Y direction. If controller 190 determines that jumper wire 110 fails to be caught properly in S9 (S9: NO), controller 190 moves work head 60 to a position lying above discard box 15 and causes jumper wire 110 caught by chucks 65, 66 to be discarded into discard box 15 (S11). Then, controller 190 executes again the processing operations from S5. As a result, work head 60 executes again the processing operations of picking up and removing jumper wire 110 from tray-type component supply device 97 (S5).

The processing operation performed by controller 190 when jumper wire 110 fails to be caught properly is not limited to the processing operation of discarding jumper wire 110 into discard box 15. For example, if controller 190 detects based on the image data imaged by part camera 28 that chucks 65 66 cannot catch jumper wire 110, in other words, that to begin with, chucks 65, 66 fail to catch and pick up jumper wire 110 (S9: NO), controller 190 may execute the processing operations from S5 without executing the processing operation in S11. In this case, in order to cause chucks 65, 66 to catch and pick up jumper wire 110 again, controller 190 moves chucks 65, 66 not to the position above discard box 15 but to the position above the supply position of tray-type component supply device 97. In the case that work head 60 is not imaged in the image data imaged by part camera 28, that is, in the case that part camera 28 fails to image work head 60, controller 190 may execute the processing operations from S7. In this case, part camera 28 is caused to image work head 60 again. In this way, in this embodiment, controller 190 can operate appropriately in accordance with the catching state of jumper wire 110 based on the image data imaged by part camera 28.

Figure 14:
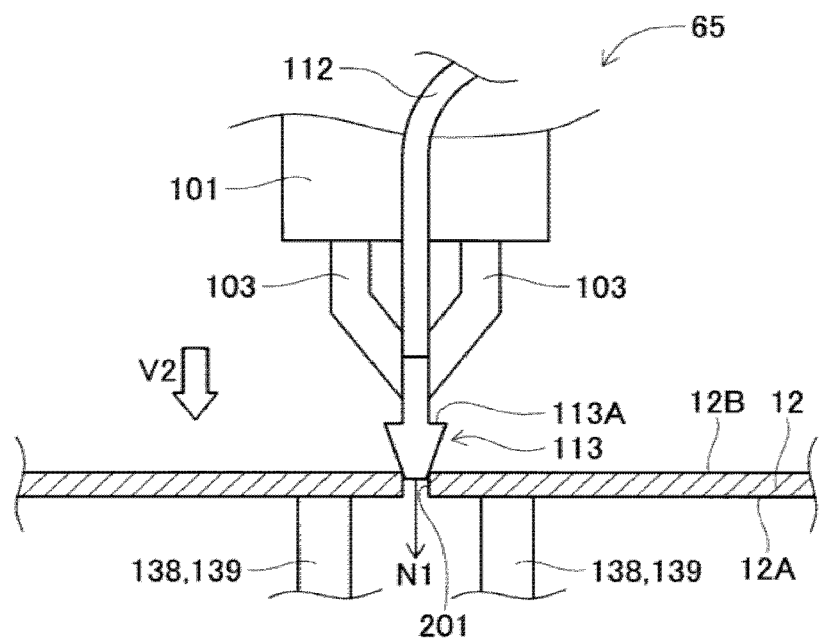
FIG. 14 is a schematic drawing showing a state in which a first end portion of the jumper wire is being mounted in a through hole in a circuit substrate.

On the other hand, if controller 190 determines in S9 that jumper wire 110 is caught properly (S9:YES), controller 190 executes a mounting operation of mounting jumper wire 110 on circuit substrate 12. FIG. 14 shows schematically a state in which first end portion 113 is mounted on circuit substrate 12. As shown in FIG. 14, through hole 201 into which first end portion 113 is mounted is formed in circuit substrate 12. Through hole 201 is formed in such a manner as to penetrate circuit substrate 12 in the up-down direction. In this embodiment, the connecting section is not limited to through hole 201 and hence may be another connecting member such as a connector through which jumper wire 110 can be connected with circuit substrate 12.

Controller 190 moves work head 60, so that chuck 65 is disposed above through hole 201 (S13). In moving work head 60, controller 190 corrects the position of first end portion 113 caught by chuck 65 by controlling drive device 90 and the like based on the image data imaged by part camera 28. In addition, as shown in FIG. 14, cut and clinch device 33 is disposed at a lower surface 12A side of circuit substrate 12. To describe this in detail, fixed section 138 and movable section 139 of cut and clinch device 33 are disposed so as to be brought into contact with lower surface 12A of circuit substrate 12. For example, pair of slide bodies 134 (refer to FIG. 7) are disposed in such a manner as to define one through hole 201 therebetween. Pair of slide bodies 134 each stay in a state in which fixed section 138 and movable section 139 are in contact with lower surface 12A or a state in which fixed section 138 and movable section 139 are kept slightly apart from lower surface 12A. Upper surface 138A (refer to FIG. 8) of fixed section 138 and bent portion 147 of movable section 139 are kept in contact with lower surface 12A of circuit substrate 12. Controller 190 determines on a position where through hole 201, a wiring pattern on lower surface 12A, an electronic component mounted on the lower surface 12A side, and the like can be avoided and disposes fixed section 138 and movable section 139 in the position so determined. Therefore, the position where to dispose fixing section 138 and movable section 139 is changed as required in accordance with a position where a component is mounted or the position of through hole 201. An elastic member (rubber or the like) for protection of circuit substrate 12 may be provided at upper surface 138A of fixing section 138 and bent portion 147.

Figure 15:
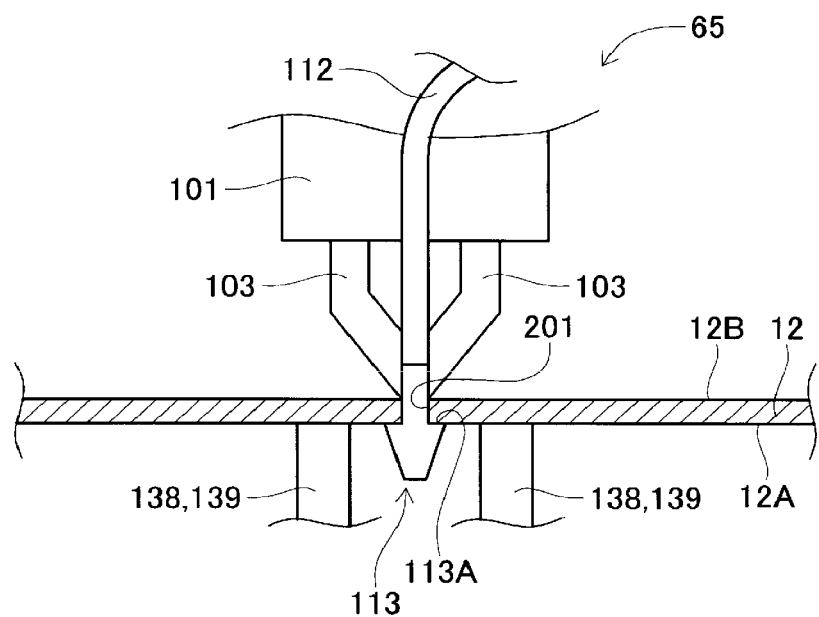
FIG. 15 is a schematic drawing showing a state in which the first end portion of the jumper wire has been inserted in the through hole in the circuit substrate.

Controller 190 causes chuck 65 to descend, so that first end portion 113 is inserted into through hole 201 (S13). Controller 190 drives drive device 90, so that chuck 65 descends. Controller 190 may drive work head moving device 64, so that chuck 65 descends. Controller 190 may drive both drive device 90 and work head moving device 64, so that chuck 65 descends. Chuck 65 inserts first end portion 113 into an interior of through hole 201 from an upper surface 12B side of circuit substrate 12. Chuck 65 continues to insert first end portion 113 into the interior of through hole 201 until engagement section 113A moves to the lower surface 12A side, as shown in FIG. 15. First end portion 113 is kept mounted on circuit substrate 12 with engagement section 113A kept in engagement with lower surface 12A.

Therefore, in this embodiment, circuit substrate 12 has a flat plate-like shape and includes upper surface 12B (an example of a first surface) and lower surface 12A (an example of a second surface) which faces upper surface 12B. Then, when mounting first end portion 113 of jumperwire 110 which is disposed on the upper surface 12B side into through hole 201, cut and clinch device 33 supports circuit substrate 12 from the lower surface 12A side. According to this configuration, by supporting circuit base 12 from the lower surface 12A side, when pushing first end portion 113 into the interior of through hole 201, circuit substrate 12 can be prevented from swelling downwards in a curvilinear fashion. Therefore, first end portion 113 can be mounted in through hole 201 in an ensured fashion. The substrate support device for supporting circuit substrate 12 is not limited to cut and clinch device 33. Component mounter 10 may include, for example, multiple pillar-shaped pins as the substrate support device for supporting circuit substrate 12. In addition, cut and clinch device 33 may support circuit substrate 12 only either when mounting first end portion 113 (S13) or when mounting second end portion 114 (S17).

In addition, when inserting first end portion 113 into through hole 201, controller 190 controls a load by which first end portion 113 is pushed by chuck claws 103. To describe this in detail, as shown in FIG. 14, chuck 65 moves, for example, at descending speed V2, bringing a distal end of first end portion 113 into contact with an opening of through hole 201. Chuck claws 103 push first end portion 113 into the interior of through hole 201 with pushing load N1. In this embodiment, controller 190 can detect pushing load N1 with which chuck claws 103 push first end portion 113 or a detection value corresponding to pushing load N1. For example, controller 190 executes a control corresponding to pushing load N1 based on a current value of a driving current generated in drive circuit 192 (refer to FIG. 9) for driving drive device 90. Controller 190 causes drive device 90 to operate through feedback control so that the magnitude of a current value of a driving current generated in drive circuit 192 coincides with a current value corresponding to a target load set in control data D1. This enables pushing load N1 to coincide with the target load. In addition, first end portion 113 can be mounted in through hole 201 while restraining circuit substrate 12 and first end portion 113 from failing by controlling pushing load N1. In this embodiment, component mounter 10 supports circuit substrate 12 from below using fixed section 138 and movable section 139 of cut and clinch device 33. As a result, circuit substrate 12 can be prevented from bending downwards curvilinearly when first end portion 113 is pushed into the interior of through hole 201, thereby making it possible to control pushing load N1 with good accuracy. Controller 190 may convert a current value of a driving current generated in drive circuit 192 into a value of pushing load N1 for comparison with the target load. That is, controller 190 may control drive device 90 by converting a current value into a load.

Next, when first end portion 113 has been mounted on circuit substrate 12, controller 190 moves work head 60 (S15). Controller 190 moves work head 60, so that chuck 66 is disposed in a position lying above a through hole into which second end portion 114 is mounted (S15). Controller 190 moves chuck 66 in accordance with a position of the through hole. In the case that drive device 90 can move chuck 66 to the position lying above the through hole without moving work head 60, controller 190 may not execute S15. In this case, controller 190 may start mounting work of mounting second end portion 114 in S17 by causing chuck 66 to descent without moving work head 60.

In S15, controller 190 moves work head 60 based on, for example, the mounting or mounting position of second end portion 114 (the position of through hole 203 shown in FIG. 16) which is set in control data D1 and disposes chuck 66 in the mounting position. As a result, even when the mounting positions of first end portion 113 and second end portion 114 are spaced far apart from each other or even when the mounting positions are in a complex positional relationship, second end portion 114 can be mounted by moving work head 60 after first end portion 113 has been mounted.

Figure 16:
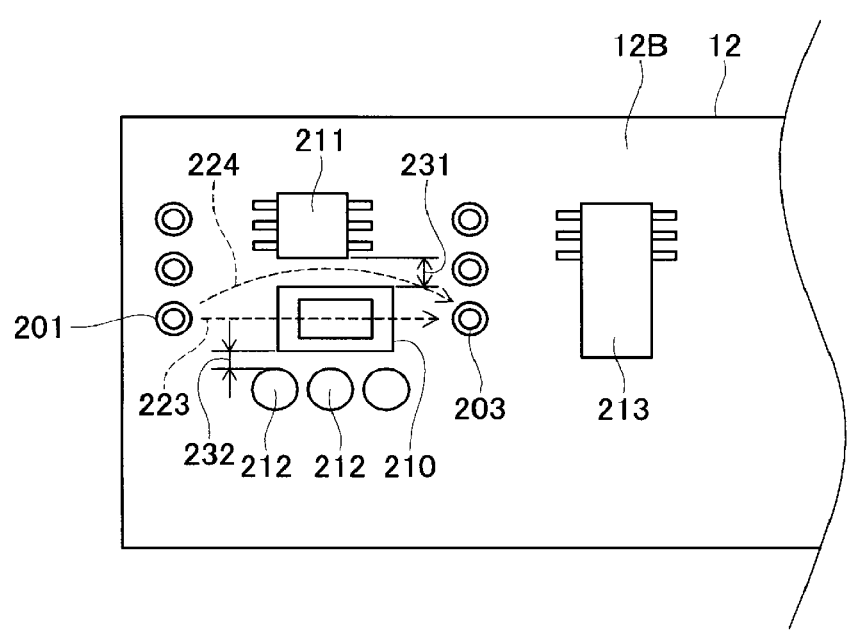
FIG. 16 is a plan view of the circuit substrate.
Figure 17:
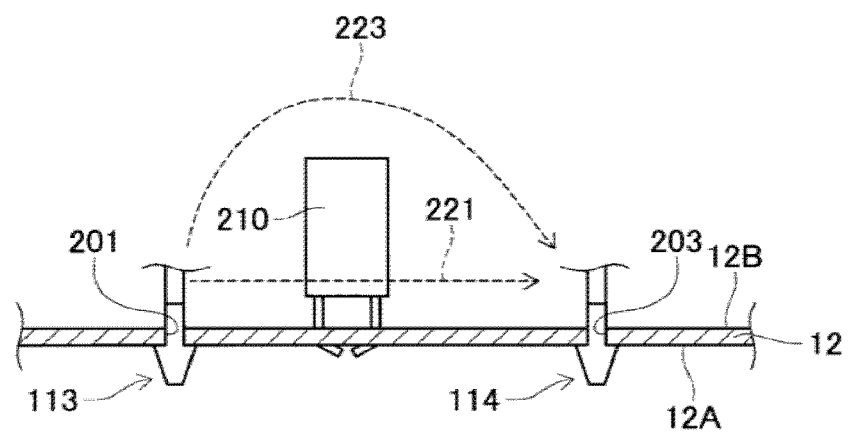
FIG. 17 is a cross-sectional view of the circuit substrate, showing schematically an arrangement of the jumper wire on the circuit substrate.

When a component mounted on circuit substrate 12 in S3 exists between through hole 201 with which first end portion 113 is connected and through hole 203 (refer to FIG. 16) with which second end portion 114 is connected, controller 190 moves work head 60 in accordance with the position of the component in S15. As a result, jumper wire 110 can be disposed in such a manner as to avoid the component. FIG. 16 shows schematically a plan view of circuit substrate 12 on which components are mounted. FIG. 17 shows schematically a cross-sectional view of circuit substrate 12 showing schematically, in turn, a state in which jumper wire 110 is disposed on circuit substrate 12.

As shown in FIGS. 16 and 17, various types of components 210, 211, 212, 213 are mounted on circuit substrate 12 in S3. When components 210 to 213 have already been mounted on circuit substrate 12, there is a possibility that jumper wire 110 cannot be disposed at a shortest distance over which through hole 201 in which first end portion 113 is mounted is connected with through hole 203 in which second end portion 114 is mounted. For example, in the case shown in FIGS. 16 and 17, component 210 that has already been mounted is disposed on path 221 (refer to FIG. 17) that connects through hole 201 with through hole 203 at the shortest distance. Due to this, in order to evade component 210, controller 190 sets path 223 that passes over component 210 or path 224 that passes around component 210 as a path where to dispose jumper wire 110. When referred to herein, a state in which component 210 is evaded means, for example, a state in which jumper wire 110 is disposed in such a manner as to be bent curvilinearly so that jumper wire 110 is prevented from being brought into contact with component 210, a state in which jumper wire 110 is disposed in such a manner as to extend along an outer circumferential surface of contact 210 while jumper wire 110 is left in contact with component 210, or the like. That is, the state in which component 210 is evaded means a state in which jumper wire 110 is disposed in such a manner as to extend around component 210 in accordance with the position, shape, size, and the like of component 210.

Controller 190 sets a path along which jumper wire 110 is disposed based on, for example, control data D1 and moves work head 60 based on the path so set (S15). For example, pieces of information on positions where components 210 to 213 are mounted, shapes and sizes of components 210 to 213, a length of jumper wire 110, a permissible bending angle of jumper wire 110, and the like are set in control data D1. Controller 190 calculates distances, angles, and the like of paths 223, 224 described above based on these pieces of information set in control data D1 and selects one of paths 223, 224. For example, controller 190 sets path 223 or path 224 whose length is closer to the length of jumper wire 110 as a path along which jumper wire 110 is disposed, that is, a path along which chuck 66 of work head 60 is caused to move. Alternatively, controller 190 sets path 223 or path 224 which has a smaller path curvature as a path along which jumper wire 110 is disposed. Paths 223, 224 may be a path extending along an outer peripheral surface of component 210 or a path passing a position lying a predetermined distance away from the outer peripheral surface of component 210.

Controller 190 may set a path along which jumper wire 110 is disposed based on not only the distances and curvatures of paths 223, 224 but also other pieces of information such as spaces among components 210 to 213. For example, components 211 and 212 are mounted on sides of component 210. As shown in FIG. 16, gap 231 between component 210 and component 211 is wider than a gap 232 between component 210 and components 212. In this case, controller 190 selects, for example, path 224 which passes through gap 231 which is wider. As a result, in disposing jumper wire 110, jumper wire 110 can be prevented from being caught by components 212 and the like. Controller 190 may execute setting of a path along which jumper wire 110 is disposed when starting S15 or may do in advance before starting S15 (when executing S1).

Controller 190 moves work head 60 based on the path so set (S15). Controller 190 causes work head moving device 64 to move work head 60, causing chuck 66 catching second end portion 114 to move along the path. Jumper wire 110 is disposed so as to extend along the path (S15).

Therefore, in this embodiment, when there exist components 210 to 212 which are mounted on circuit substrate 12 between through holes 201 (an example of a first connecting section) and through holes 203 (an example of a second connecting section), controller 190 moves work head 60 in accordance with the positions of components 210 to 212 so as to dispose jumper wire 110 in such a way as to evade components 210 to 212. As a result, even when components 210 to 212 are so mounted on circuit substrate 12, jumper wire 110 can be disposed along paths 223, 224 which pass around components 210 to 212.

Here, for example, in the even that circuit substrate 12 constitutes a substrate for a power supply, it is highly possible that large components 210 to 213 such as a capacitor, a transformer, a heat sink, and the like are mounted on circuit substrate 12. Then, it becomes difficult to dispose jumper wire 110 along shortest path 221. Therefore, for power supply circuit substrate 12 on which relatively large components 210 to 213 are mounted, the control performed to dispose jumper wire 110 by evading components 210 to 213 as described above becomes extremely effective.

In addition, in mounting components 210 to 213, in the event that jumper wire 110 has already been mounted on circuit substrate 12, it becomes difficult to mount components 210 to 213 as required. For this reason, as in this embodiment, the mounting procedure is such that jumper wire 110 is mounted (S13 to S17) after components 210 to 213 are mounted (S3). In other words, since jumper wires 110 is mounted after components 210 to 213 are mounted, it is highly possible that the mounting work of jumper wire 110 is affected by components 210 to 213 which have already been mounted. Therefore, in fabricating circuit substrate 12 on which components 210 to 213 and jumper wire 110 are mounted, the control performed to dispose jumper wire 110 by evading components 210 to 213 as described above becomes extremely effective.

Returning to FIG. 10, controller 190 causes second end portion 114 to be mounted in through hole 203 (refer to FIG. 16) after having moved work head 60 in S15 (S17). Controller 190 controls work head 60 as in S13, causing chuck 66 to install second end portion 114 in an interior of through hole 203. As a result, jumper wire 110 can be mounted on circuit substrate 12.

Next, controller 190 determines whether there is any other jumper wire 110 to be mounted (S19). Controller 190 determines whether there is jumper wire 110 to be mounted next based on the information set in control data D1. If controller 190 determines that there is jumper wire 110 to be mounted (S19: NO), controller 190 executes the processing operations from S5 again and starts mounting next jumper wire 110. On the other hand, if controller 190 determines that there exists no jumper wire 110 to be mounted next, that is, that all necessary jumper wires 110 have been mounted completely (S19: YES), controller 190 ends the processing operations shown in FIG. 10. Controller 190 conveys circuit substrate 12 on which components 210 to 213 and jumper wire 110 have been mounted completely to a downstream device in the production line. In this way, in this embodiment, component mounter 10 executes the mounting work of jumper wire 110 using chucks 65, 66.

(Parameter Setting)

In this embodiment, component mounter 10 is such that the operation of work head 60 can be set in detail in the mounting work of jumper wire 110. For example, in the catching and picking up operation of jumper wire 110 shown in FIG. 11, a speed at which chuck 65 is caused to ascend after catching first end portion 113 with chuck claws 103 is referred to as rising speed V1. This ascending speed V1 can be changed by changing a set value therefor set in control data D1. For example, controller 190 may receive a value for ascending speed V1 according to input information at display device 13 of component mounter 10 shown in FIG. 1 and set the received value in control data D1. Display device 13 may include a touch panel for inputting information. Alternatively, a user may change control data D1 of component mounter 10 so as to change ascending speed V1 by operating the management computer on the production line. As a result, the user can change ascending speed vi by changing control data D1. The user can improve the catching and picking up operation of first end portion 113 by adjusting ascending speed V1 as when chuck 65 fails to catch and pick up first end portion 113.

The set value which can be set as described above is not limited to ascending speed V1. For example, component mounter 10 may be configured so that an acceleration speed and a deceleration speed when chucks 65, 66 are caused to ascend can be set. In addition, component mounter 10 may be configured so that a descending speed V2 (refer to FIG. 14) or the like for chucks 65, 66 not only when catching and picking up jumper wire 110 from tray-type component supply device 97 but also when mounting jumper wire 110 on circuit substrate 12 can be set. Further, component mounter 10 may be configured so that a position where first end portion 113 is caught by chuck claws 103, a load by which first end portion 113 is caught by chuck claws 103, pushing load N1 applied when first end portion 113 is inserted into through holes 201, 203, positions where first end portion 13 is inserted into through holes 201, 203 or the like can be set. Component mounter 10 may be configured so that paths 223, 224 along which work head 60 is moved, a moving direction of work head 60, a passing position which work head 60 passes in S15 can be set.

Incidentally, upper surface 12B is an example of a first surface. Lower surface 12A is an example of a second surface. Part camera 28 and side camera 67 constitute an example of an imaging device. Cut and clinch device 33 is an example of a substrate support device. Clamping device 52 is an example of a substrate holding device. Chuck 65 is an example of a first holding section. Chuck 66 is an example of a second holding section. Jumper wire 110 is an example of a wire member. Controller 190 is an example of a control device. Through hole 201 is an example of a first connecting section. Through hole 203 is an example of a second connecting section. Tray-type component supply device 97 is an example of a supply device.

Thus, according to the embodiment that has been described heretofore, the following effects are provided. In this embodiment, controller 190 mounts first end portion 113 caught by chuck claws 103 of chuck 65 into through hole 201 in circuit substrate 12 (S13). After having mounted first end portion 113 in through hole 201, controller 190 causes work head moving device 64 to move work head 60 in accordance with the position of through hole 203 (S15, refer to FIG. 16). Then, controller 190 mounts second end portion 114 caught by chuck claws 103 of chuck 66 in through hole 203 in circuit substrate 12 (S17).

According to this configuration, work head 60 is caused to move after first end portion 113 has been mounted in through hole 201. By moving work head 60 in accordance with the position of through hole 203, the position of chuck 66 and the position of through hole 203, that is, the position of second end portion 114 and the position of through hole 203 can be aligned with each other. As a result, even in the case that through holes 201, 203 are disposed complexly, first end portion 113 and second end portion 114 of jumper wire 110 can be mounted in through holes 201, 203 in circuit substrate 12, respectively. When referred to herein, the case in which through holes 201, 203 are disposed complexly means a case in which through holes 201, 203 are disposed in positions lying spaced away from each other in circuit substrate 12. Alternatively, the case in which through holes 201, 203 are disposed complexly means a case in which component 210 mounted on circuit substrate 12 exists between through hole 201 and through hole 203.

As shown in FIG. 9, controller 190 includes first mounting section 261, moving section 263, second moving section 265, and determination section 267. First mounting section 261 and the like are, for example, processing modules which are realized by executing the control program in control data D1 by CPU of controller 190. First mounting section 261 and the like do not necessarily have to be configured by software such as the processing modules and hence may be configured by hardware such as processing circuits. First mounting section 261 and the like may be configured by a combination of software and hardware. First mounting section 261 causes first end portion 113 caught by chuck 65 (the example of the first holding section) to be mounted into through hole 201 (the example of the first connecting section). After first end portion 113 has been mounted in through hole 201, moving section 263 causes work head moving device 64 to move work heads 60, 62 in accordance with the position of through hole 203 (the example of the second connecting section). Second mounting section 265 causes second end portion 114 caught by chuck 66 (the example of the second holding section) to be mounted in through hole 203. Determination section 267 determines whether jumper wire 110 is caught properly by chucks 65, 66 based on the image data imaged by part camera 28 (the example of the imaging device). Here, the step (S13) executed by first mounting section 261 is an example of a first mounting step. The step (S15) executed by moving section 263 is an example of a moving section. The step (S17) executed by second mounting section 265 is an example of a second mounting step.

It should be noted that this patent application is not limited to the embodiment that has been described heretofore and hence can be carried out in various modes in which various modifications and improvements are made based on the knowledge of those skilled in the art to which the patent application pertains. For example, the first and second connecting sections of this patent application are not limited to through holes 201, 203 and hence may be, for example, connectors provided on circuit substrate 12. In this case, first end portion 113 and second end portion 114 of jumper wire 110 may include connectors configured to be connected with the connectors on circuit substrate 12. Then, controller 190 may cause the connectors on jumper wire 110 to be inserted into the connectors on circuit substrate 12. In addition, in this embodiment, while controller 190 mounts jumper wire 110 (S13 to S17) after the components have been mounted (S3), controller 190 may mount jumper wire 110 before the components are mounted. Further, while controller 190 executes the control for evading components 210 to 212 mounted on circuit substrate 12 after first end portion 113 has been mounted, controller 190 may be configured so as not to execute the evading control. While controller 190 determines whether jumper wire 110 is properly caught based on the image data imaged by part camera 28 (S9), controller 190 may be configured so as not to execute this determination processing. Component mounter 10 does not have to support circuit substrate 12 from lower surface 12A using cut and clinch device 33 when jumper wire 110 is mounted on circuit substrate 12. Component mounter 10 does not have to include cut and clinch device 33.

Controller 190 may be configured so as not to execute the control based on pushing load N1. The work machine of this patent application does not have to include component supply device 30, bulk component supply device 32, and the like which are configured to supply components. That is, the work machine may be configured so as to include only clamping device 52 (the example of the substrate holding device), work heads 60, 62, work head moving device 64 (an example of a head moving device), and control device 34.

REFERENCE SIGNS LIST

10 Component mounter (work machine), 12 Circuit substrate, 12B Upper surface (First surface), 12A Lower surface (Second surface), 28 Part camera (Imaging device), 33 Cut and clinch device (Substrate support device), 34 Control device, 52 clamping device (Substrate holding device), 60, 62 Work head, 64 Work head moving device, 65 Chuck (First holding device), 66 Chuck (Second holding device), 67 Side camera (Imaging device), 97 Tray type component supply device (Supply device), 110 Jumper wire (Wire member), 113 First end portion, 114 Second end portion, 190 Controller (Control device), 201 Through hole (First connecting section), 203 Through hole (Second connecting section), 210, 211, 212 Component.

The invention claimed is:

1. A work machine comprising:
a substrate holding device including a clamp configured to hold a circuit substrate including a first connecting section and a second connecting section on a first surface of the circuit substrate;
a work head configured to hold a wire member including a first end portion and a second end portion so as to mount the wire member on the circuit substrate held by the substrate holding device;
a work head moving device configured to move the work head, the work head including a first chuck configured to hold the first end portion; and a second chuck configured to hold the second end portion; and
a control device configured to
mount the first end portion, being held by the first chuck, on the first connecting section;
determine multiple paths of the wire member to be bent between the first connecting section and the second connecting section so as to avoid contacting a component mounted on the first surface of the circuit substrate;
select a path out of the multiple paths based on a predetermined criteria;
cause the work head moving device to move the work head in accordance with a position of the component and a position of the second connecting section after having mounted the first end portion on the first connecting section based on the path; and
mount the second end portion, being held by the second chuck, on the second connecting section.

2. The work machine according to claim 1, further comprising:
a supply device configured to supply the wire member to the work head; and a camera configured to image the work head holding the wire member, wherein the camera images the work head after the wire member is supplied from the supply device to the work head,
wherein the control device is configured to determine whether the wire member is held properly by the first chuck and the second chuck based on image data imaged by the camera.

3. The work machine according to claim 1,
wherein the circuit substrate includes the first surface and a second surface that faces the first surface, and
wherein the work machine further comprises:
a substrate support configured to support the circuit substrate from the second surface in at least one of a case in which the first end portion of the wire member disposed on the first surface is mounted in the first connecting section and a case in which the second end portion of the wire member disposed on the first surface is mounted in the second connecting section.

4. The work machine according to claim 1,
wherein the path is curved over the component.

5. The work machine according to claim 1,
wherein the path is curved around a side of the component.

6. The work machine according to claim 1,
wherein the predetermined criteria is a shortest path curvature among the multiple paths.

7. A mounting method for a work machine comprising a substrate holding device configured to hold a circuit substrate comprising a first connecting section and a second connecting section on a first surface of the circuit substrate, a work head configured to hold a wire member comprising a first end portion and a second end portion so as to mount the wire member on the circuit substrate held by the substrate holding device, and a work head moving device configured to move the work head, the mounting method being configured to mount the wire member on the circuit substrate, the work head comprising:
a first chuck configured to hold the first end portion; and
a second chuck configured to hold the second end portion,
the mounting method comprising:
a first mounting step of mounting the first end portion held by the first chuck on the first connecting section;
a determining step of determining multiple paths of the wire member to be bent between the first connecting section and the second connecting section so as to avoid contacting a component mounted on the first surface of the circuit substrate;
a selecting step of selecting a path out of the multiple paths based on a predetermined criteria;
a moving step of causing the work head moving device to move the work head in accordance with a position of the component and a position of the second connecting section after the first end portion has been mounted on the first connecting section, based on the path; and
a second mounting step of mounting the second end portion held by the second chuck on the second connecting section.

* * * * *